United States Patent
Kamal et al.

(10) Patent No.: US 9,929,733 B1
(45) Date of Patent: Mar. 27, 2018

(54) CONNECTION PROPAGATION FOR INTER-LOGICAL BLOCK CONNECTIONS IN INTEGRATED CIRCUITS

(71) Applicant: QUALCOMM Incorporated, San Diego, CA (US)

(72) Inventors: Pratyush Kamal, San Diego, CA (US); Kambiz Samadi, San Diego, CA (US); Jing Xie, San Diego, CA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/437,871

(22) Filed: Feb. 21, 2017

(51) Int. Cl.
*H01L 23/522* (2006.01)
*H03K 19/094* (2006.01)
*H01L 23/528* (2006.01)
*H01L 27/06* (2006.01)
*H01L 27/118* (2006.01)

(52) U.S. Cl.
CPC ......... *H03K 19/094* (2013.01); *H01L 23/528* (2013.01); *H01L 23/5226* (2013.01); *H01L 27/0688* (2013.01); *H01L 27/11807* (2013.01); *H01L 2027/11851* (2013.01); *H01L 2027/11872* (2013.01); *H01L 2027/11875* (2013.01)

(58) Field of Classification Search
CPC ............... H01L 23/5226; H01L 23/528; H01L 27/0688; H01L 27/11807; H01L 2027/11851; H01L 2027/11872; H01L 2027/11875; H03K 19/094

See application file for complete search history.

(56) References Cited

U.S. PATENT DOCUMENTS

| | | | |
|---|---|---|---|
| 7,904,770 B2 | 3/2011 | Toms | |
| 8,832,298 B2 | 9/2014 | Ginde | |
| 8,832,608 B1 * | 9/2014 | Chakrabarty | G06F 17/505 716/51 |
| 9,013,235 B2 | 4/2015 | Kamal et al. | |
| 9,098,666 B2 | 8/2015 | Samadi et al. | |
| 9,123,721 B2 | 9/2015 | Samadi et al. | |
| 9,171,608 B2 | 10/2015 | Xie et al. | |
| 9,341,672 B2 * | 5/2016 | Goel | G11C 29/50 |
| 2005/0236703 A1 * | 10/2005 | Kazi | G01R 31/3008 257/678 |
| 2006/0129712 A1 * | 6/2006 | Raghuram | G11C 5/02 710/52 |
| 2011/0010525 A1 * | 1/2011 | Binkert | G06F 15/17343 712/29 |

(Continued)

*Primary Examiner* — Alexander H Taningco
*Assistant Examiner* — Kurtis R Bahr
(74) *Attorney, Agent, or Firm* — Seyfarth Shaw LLP

(57) ABSTRACT

A 3D integrated circuit reduces delay when a signal traverses logical blocks of the integrated circuit. In one instance, the 3D integrated circuit has a first tier and a second tier including one or more first and second logical blocks, respectively. The first logical block(s) include a first primary output logic gate, a first primary input logic gate, a first primary input pin and a first primary output pin. The first primary output pin lies within a perimeter defined by a total area occupied by logic gates of the first logical block(s). The second logical block(s) include a second primary output logic gate, a second primary input logic gate, a second primary input pin and a second primary output pin. The second primary input pin is coupled to the first primary output pin.

16 Claims, 6 Drawing Sheets

(56) References Cited

U.S. PATENT DOCUMENTS

| | | | |
|---|---|---|---|
| 2012/0280231 A1* | 11/2012 | Ito | G01R 31/318536 257/48 |
| 2012/0319717 A1* | 12/2012 | Chi | G01R 31/318513 324/756.05 |
| 2014/0111243 A1* | 4/2014 | Kumar Goel | G01R 31/2601 324/762.02 |
| 2014/0253196 A1* | 9/2014 | Du | H01L 27/0688 327/202 |
| 2014/0269022 A1* | 9/2014 | Xie | G11C 11/412 365/154 |
| 2015/0179568 A1* | 6/2015 | Chang | G06F 17/5072 257/774 |

* cited by examiner

CONNECTION PROPAGATION FOR INTER-LOGICAL BLOCK CONNECTIONS IN INTEGRATED CIRCUITS

BACKGROUND

Field

The present disclosure generally relates to integrated circuits (ICs). More specifically, the present disclosure relates to inter-block connections between logical or functional blocks of an integrated circuit, in which each of the logical blocks includes a sea of gates for performing a complete circuit function.

Background

Mobile communication devices have become common in contemporary society. The prevalence of these mobile devices is driven in part by the many functions that are now enabled on such devices. Demand for such functions increases processing capability requirements of mobile devices. The limited space of the housing of a mobile communication device contributes to the pressure for a continued miniaturization of components within the circuitry. While miniaturization has been of particular concern in the integrated circuits (ICs) of mobile communication devices, efforts at miniaturization of ICs in other devices have also proceeded.

Historically, elements within an IC have all been placed in a single two-dimensional (2D) active layer with elements interconnected through one or more metal layers that are also within the IC. Efforts to miniaturize are reaching their limits in a 2D space and thus, designs have moved to three dimensions (3D). While there have been previous efforts to connect two or more logical blocks of two-dimensional and/or three-dimensional integrated circuits, the solutions are subject to delay experienced in a transmission path through the two or more logical blocks.

SUMMARY

A 3D integrated circuit device may include a first tier having one or more first logical blocks. The one or more first logic blocks including a first primary output logic gate, a first primary input logic gate, a first primary input pin and a first primary output pin. The first primary output pin lies within a perimeter defined by a total area occupied by logic gates of the first logical block(s) of the first tier. The 3D integrated circuit device may further include a second tier having one or more second logical blocks. The second logical block(s) include a second primary output logic gate, a second primary input logic gate, a second primary input pin and a second primary output pin. The second primary input pin is coupled to the first primary output pin.

A logical connection propagation method may include coupling a first primary output pin of a first tier to a second primary input pin of a second tier of a 3D IC. The first tier includes one or more first logical blocks. The first logical block(s) include a first primary output logic gate, a first primary input logic gate, and a first primary input pin. The first primary output pin lies within a perimeter defined by a total area occupied by logic gates of the first logical block(s) of the first tier. The second tier includes one or more second logical blocks. The second logical block(s) include a second primary output logic gate, a second primary input logic gate, and a second primary output pin. The method also includes bypassing one or more timing related or non-functional logic gates while coupling the first primary output pin of the first tier to the second primary input pin of the second tier of the 3D IC.

A 3D integrated circuit device may include a first tier having one or more first logical blocks. The first logic block(s) include a first primary input pin and a first primary output pin. The first primary output pin lies within a perimeter defined by a total area occupied by logic gates of the first logical block(s) of the first tier. The 3D integrated circuit device also includes means for implementing a first logical function of the first logic block(s). The first logical function implementing means is directly coupled to the first primary output pin. The integrated circuit device also includes means for implementing a second logical function of the one or more first logic blocks. The second logical function implementing means is directly coupled to the first primary input pin. The 3D integrated circuit device may further include a second tier having one or more second logical blocks. The second logical block(s) include a second primary output logic gate, a second primary input logic gate, a second primary input pin and a second primary output pin. The second primary input pin is coupled to the first primary output pin.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
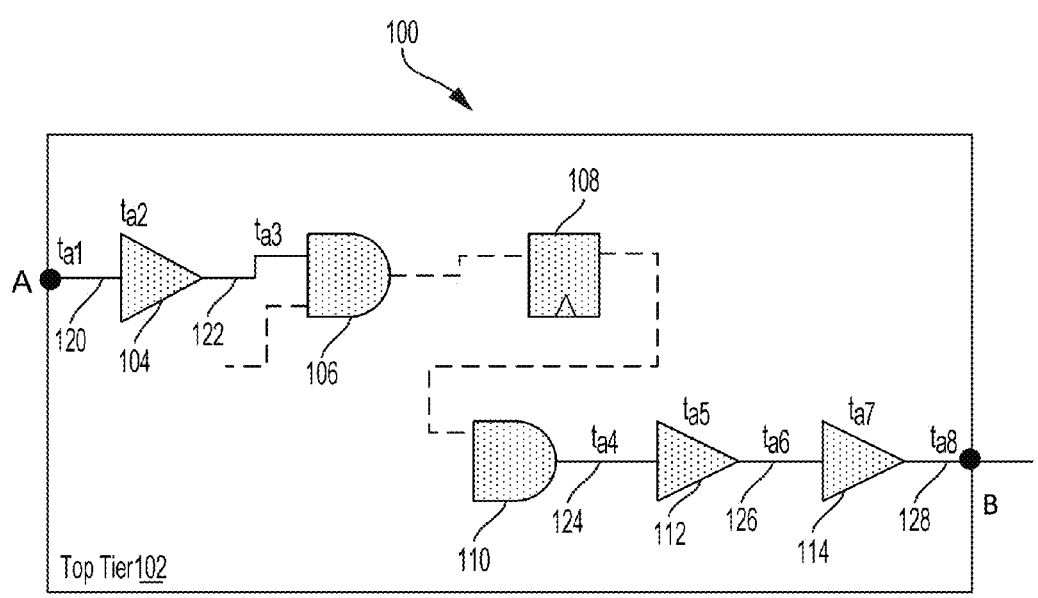
FIG. 1 illustrates a first logical block including multiple gates coupled together to perform a complete circuit function according to aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Aspects of the present disclosure are directed to reducing delay when a signal traverses logical blocks of an integrated circuit through optimized or improved inter-block connections that provide input and output access to the multiple gates of the logical blocks. Conventionally, inter-block connections occur between a primary output of a first logical device and a primary input of a second logical device. The primary input/output of the conventional logical blocks, however, is positioned at the periphery of the logical blocks. Accordingly, the conventional inter-block connection causes additional delays during operation of the logical blocks of integrated circuits. A "primary" input/output is a connection to or from the die of the logical block In two-dimensional (2D) and three-dimensional (3D) configurations, all of the primary input/output (I/O) pins of the logical blocks are placed at a boundary of each of the logical blocks. The primary input/output (I/O) pins are configured for inter-block connections where each of the logical blocks are connected to other logical blocks through inter-block wiring. One feature of three-dimensional (3D) stacking technology is the construction of a complete circuit across multiple dies stacked as tiers. Each part of the circuit is prepared on a separate die, and then the dies or tiers are stacked together and joined to create a complete circuit.

Three-dimensional (3D) stacking technology can be incorporated into circuits in a variety of ways, ranging from the placement of different circuit functions in separate tiers, to the formation of a single logic gate split across multiple tiers. At an intermediate level, a single functional unit or a complete circuit function can be divided over multiple tiers to form a single logical block with a primary input/output for the single functional unit. In other words, the logical block may be a multi-tier block. For example, an arithmetic logic unit (ALU) can have its computation and register portions on separate tiers, providing shorter path lengths and increased speed between the computational and register functions.

The integrated circuit may include a first logical block that includes multiple gates (e.g., a sea of gates) for performing a specific function for an electronic system such as a mobile phone or user equipment. The multiple gates may be coupled together to provide some sort of processing capability of the complete circuit function of the logical block. Some I/O pins or terminals on the first logical block are designated as a primary input and a primary output of the first logical block. Current implementations rely on the primary I/O pins or terminals being in a pre-determined location. For example, the primary I/O pins may be placed at a boundary or a periphery of the logical block.

The primary input and the primary output of the first logical block provide access to other devices or logical blocks that perform other functions within the electronic system. For example, a logical block of a first configuration (e.g., 2D or 3D) may be coupled to another logical block (e.g., 2D or 3D) via the primary I/O pins of the logical blocks. A signal from a second logical block may be received by the first logical block through the primary input. The primary input may be the only input that provides access to the first logical block for coupling to other logical blocks. A signal to the second logical block may be output by the first logical block through the primary output of the first logical block. The primary output of the first logical block may be the only output that provides access to the first logical block for coupling to other logical blocks.

The primary input and the primary output of the first logical block may be positioned at the boundary or periphery of the first logical block for ease of bottom-up design flow and integration. In cases where a gate of the first logical block connected to the primary I/O pin is far from the primary I/O pin, buffers are added to provide timing synchronization or to meet internal timing constraints of the first logical block. For example, a buffer may be added between the input of the first gate and the primary input of the first logical block. Similarly, buffers are added between the output of a second gate and the primary output of the first logical block.

In some instances, inverters may be added between the input of a first gate (e.g., a first primary input logic gate) and the primary input of the first logical block. Similarly, inverters may be added between the output of the second gate (e.g., primary output logic gate) and the primary output of the first logical block. The inverters may be provided to vary the orientation of a signal to be processed by the first logical block. In other instances, a combination of buffers and/or inverters may be added between the input of a first gate and the primary input of the first logical block and/or between the output of the second gate and the primary output of the first logical block. Thus, the buffers and the inverters are timing related components or non-functional in the sense that they may not be specified or critical to the function of the logical blocks. Thus, for some applications or implementations, the buffers and the inverters are not crucial or specified for the complete circuit function of the logical block.

The addition of buffers and/or inverters between the input of the first gate and the primary input and/or between the output of the second gate and the primary output of the first logical block causes additional delay on the timing path through the first logical block.

In one aspect of the present disclosure, the inter-block connections may be physically and/or logically propagated to input gates/output gates of the logical blocks. Logical propagation may be implemented to reduce or remove logic gates from a logic path. The removed logic gates may be inconsequential to a logic operation through the logic path. Some of the removed logic gates may only provide timing related constraints. These removed logic gates may be buffers or inverters (e.g., pairs of inverters). For example, a second logical block may be directly coupled or connected to an input port of the first gate instead of being coupled through a designated primary input of the first logical block. The input port of the first gate of the first logical block may be a first primary input pin of the first gate. Thus, an output signal from the second logical block may be directly received at the input port of the first gate of the first logical device. By receiving the input signal at the input port of the first gate, delay associated with the inverters/buffers and connectors between the primary input and the input port of the first gate of the first logical block is avoided.

In other instances, a third logical block may be directly coupled to an output port of the second gate of the first logical block instead of being coupled through a designated primary output at a periphery of the first logical block. Thus, an output signal from the second gate of the first logical block may be directly transmitted to an input of the third logical block while avoiding delays associated with the inverters/buffers and/or connectors between the output port of the second gate and the primary output of the first logical block.

The output port of the second gate may be a first primary output pin of the second gate of the first logical block. In one aspect of the disclosure, the first primary output pin of the second gate of the first logical block is within a perimeter defined by a total area occupied by the logic gates (e.g., the first logic gate and the second logic gate) of the first logical block.

A first logical block may be positioned on a first tier while a second logical block may be positioned in a second tier of an integrated circuit. Multiple logical blocks may be positioned in the first tier and/or the second tier. In some implementations (e.g., 3D), multiple tiers form a single logical block, in which a circuit across multiple tiers performs a complete circuit function (e.g., ALU).

In some aspects, access to the first logic gate may be through an intermediate input port that is propagated or positioned along an input/output timing path that includes the inverters, buffers and/or connectors. For example, the first logical block may include a first buffer and a second buffer between the primary input and the first gate of the first logical block. A first connector connects the primary input to a first intermediate input port, which is the input port of the first buffer. A second connector connects a first intermediate output port, which is the output port of the first buffer, to a second intermediate input port, which is the input port of the second buffer. In this case, access to the input port of the first logic gate may be through the second intermediate input port of the first logical block. Accordingly, signals from a second logical block may be directly provided to the second intermediate input port while bypassing the first buffer and avoiding delays associated with the first buffer.

The first logical block may be on a first tier of an integrated circuit device while the second logical block is on a second tier of the integrated circuit device. In one aspect of the disclosure, the first logical block is configured in accordance with a three-dimensional (3D) configuration while the second logical block is configured in accordance with a two dimensional (2D) configuration. In other implementations, the first logical block and the second logical block are both configured in accordance with the 3D configuration or the 2D configuration. The connection points of the first logical block includes the primary input of the first logical block, the primary output of the first logical block, the input port of the first gate, the output port of the second gate, the second intermediate input port and/or other inputs and outputs of the first logical block. The connection points of the first logical block may be coupled to the second logical block using vias and or other interconnections such as inter-block wiring.

The second logical block may also include connection points or ports similar to the connection points of the first logical block for connecting the first and the second logical blocks together according to aspects of the present disclosure. For example, the connection points of the second logical block includes a primary input and a primary output, and a second primary input pin of the first gate. Similar to the first logical block, the second logical block may also include a second primary input logic gate and a second primary output logic gate that are coupled together to provide the complete circuit function of the second logical block.

The buffers and/or inverters are provided between an input of the second primary input logic gate and a primary input of the second logical block. The buffers and/or inverters are also provided between the output of the second primary input logic gate and a primary output of the second logical block. Other connection points of the second logical block include an input port (e.g., a second primary input pin) of the second primary input logic gate and an output port (e.g., a second primary output pin) of the second primary output logic gate. In one aspect of the disclosure, the second primary input pin of the second primary input logic gate of the second logical block is within a perimeter defined by a total area occupied by the second primary input logic gate and the second primary output logic gate.

In one aspect of the disclosure, a connection (e.g., inter-block wiring and/or vias) couples the second primary input pin of the second logical block to the first primary output pin of the first logical block. The connection remains within a perimeter of the first tier or logical block and a perimeter of the second tire or logical block. The perimeter is defined by the total area occupied by the logic gates of the first or second logical blocks. In some instances, however, the second primary input pin of the second logical block lies outside a perimeter of the second tier. The first primary output pin of the first logical block may be coupled to multiple connections and conductive layers that are coupled to the first logical block. The connections may include multiple aligned vias. The multiple vias may be disposed within multiple conductive layers to connect the first primary output pin of the first logical block to the second logical block in a different tier of an integrated circuit. The multiple vias and conductive layers may be aligned (e.g., vertically aligned). In some instances, the first logical block and/or the second logical block may each include multiple tiers in a three-dimensional configuration.

In some aspects of the disclosure, whether the primary input/output are propagated to bypass the buffers, inverters and/or connectors of the first logical block may be determined based on a desirable function or implementation of the first logical block. Bypassing these buffers or pair of inverters does not change a functionality of the logic path. For example, in some implementations inter-block connection points may remain at the primary input/output of the first logical block. In other implementations, the inter-block connections may be propagated to the input port of the first gate, the output port of the second gate, the second intermediate input port and other inputs and outputs of the first logical block.

FIG. 1 illustrates a first logical or functional block 100 including multiple gates coupled together to perform a complete circuit function or single specified function according to aspects of the present disclosure. The first logical block 100 includes a first gate 106, a second gate 108 and a third gate 110. The first logical block 100 may be on a first tier or top tier 102.

In one aspect of the disclosure, the first gate 106 is an AND gate, the second gate 108 is a flip flop, and the third gate 110 is another AND gate. The first gate 106, the second gate 108 and the third gate 110 are coupled together to function as a single logical unit. Additionally, the first logical block 100 includes devices (e.g., timing devices or inverting devices) that are directed to coordinating timing or inversion of signals to and/or from the gates of the logical block 100. For example, the timing and/or inversion devices synchronize or coordinate coupling of the first logical block 100 to a second logical block (not shown). The synchronization and/or coordination occurs when a signal traverses the first logical block 100. The coordination or inversion occurs during processing of a signal received by the first logical block 100 from the second logical block or for outputting a signal from the gates of the first logical block 100 to the second logical block. The timing and/or inversion devices may include inverters and/or buffers 104, 112 and 114.

While the first logical block 100 includes several inputs and outputs of each of the gates and the timing and/or inversion devices, the first logical block 100 is coupled to other logical blocks via a primary logical input A and a primary logical output B. Thus, input to the logical block 100 is received through the primary logical input A, and advanced through intermediary inputs and outputs of the gates and timing and/or inversion devices of the logical block. A final processing result of the entire logical block 100 is provided to the primary output B to which other devices may be coupled to receive the final processing result.

A signal received at the primary input A of the logical block 100 traverses the gates 106, 108 and 110 and the timing and/or inversion devices 104, 112 and 114. The final processing result is output at the primary output B of the logical block 100. As the received signal traverses the logical block 100, the signal is subject to delays along a transmission path that includes the gates 106, 108 and 110, the timing and/or inversion devices 104, 112 and 114.

The transmission path may include an input timing path that includes connectors 120 and 122, and the timing device 104 at an input portion of the first logical block 100. The timing device 104 receives an incoming signal and provides a delayed signal to the gates 106, 108 and 110 of the first logical block 100 for processing. The transmission path may also include an output timing path that includes connectors 124, 126 and 128, and timing devices 112 and 114 at an output portion of the first logical block 100. The timing devices 112 and 114 receive a final processing result from the gates 106, 108 and 110 and provides the final processing result to the primary output B of the first logical block 100.

Processing of the received signal is subject to delays that occur in the input timing path and the output timing path. The delay may be a sum total of the delay experienced when the received signal traverses the connectors 120 and 122, and the timing device 104, and when the final processing result traverses the connectors 124, 126 and 128, and the timing devices 112 and 114. The total delay may be given by the sum of the delay experienced at the connectors and the timing devices. For example, the delay experienced at each of the connectors 120 and 122, the timing device 104, the connectors 124, 126 and 128, and the timing devices 112 and 114 are, respectively, $t_{a1}$, $t_{a3}$, $t_{a2}$, $t_{a4}$, $t_{a6}$, $t_{a8}$, $t_{a5}$, and $t_{a7}$.

Thus, the total delay is a sum of the delay at the input timing path and the output timing path and is given as follows:

Total delay=$t_{a1}+t_{a3}+t_{a2}+t_{a4}+t_{a6}+t_{a8}+t_{a5}+t_{a7}$

The actual starting point of the logical processing (for purposes of the circuit function of the first logical block) of the received signal starts at an input port or pin A' (not shown) of the first gate 106 of the first logical block 100. The actual logical end point of processing the received signal is an output port B' (not shown) of the third logic gate 110 of the first logical block 100. The insertion of the buffer or inverter between the input port A' of the first gate 106 and the primary input A of the first logical block 100 causes additional delay on the transmission path through the first logical block 100. Similarly, the insertion of the buffers or inverters between the output port B' of the third gate 110 and the primary output B of the first logical block 100 causes additional delay on the transmission path through the first logical block 100.

Figure 2:
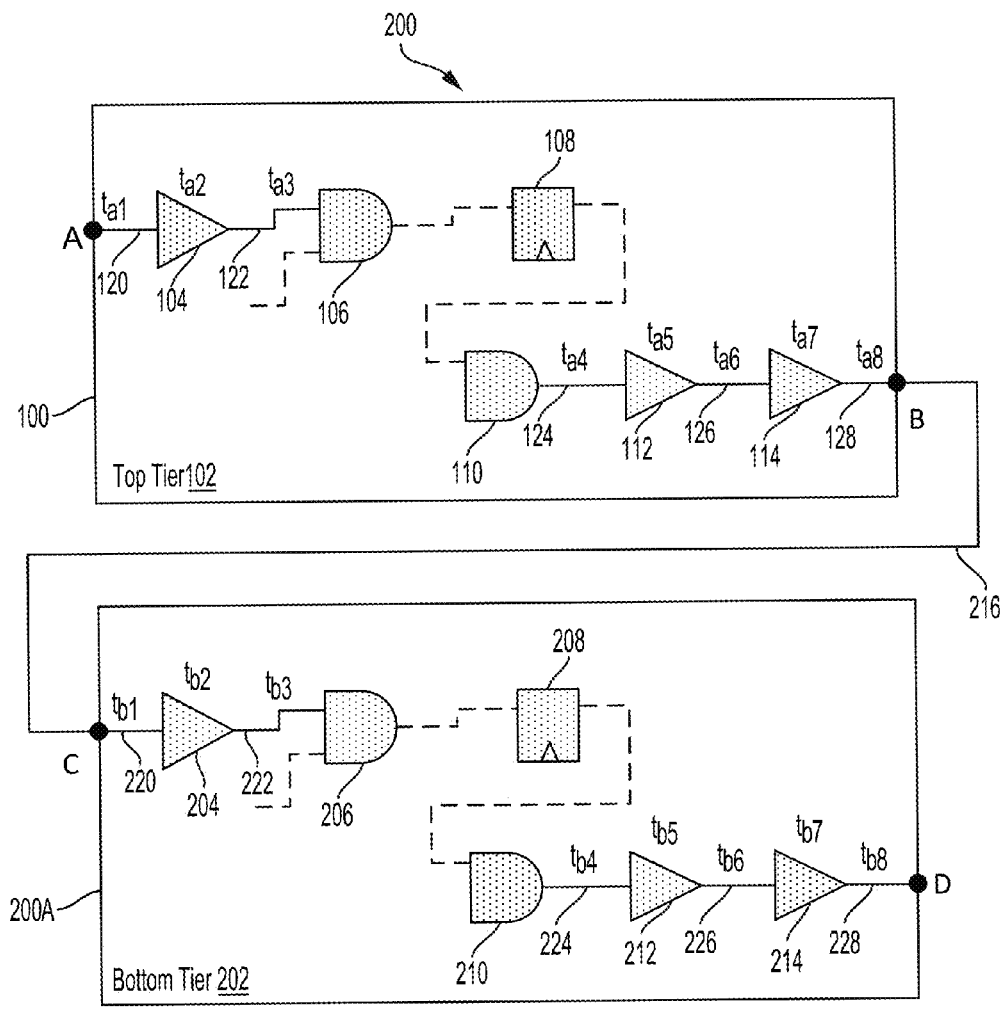
FIG. 2 illustrates an integrated circuit device including a first logical block 100 coupled to a second logical block, in which the logical blocks include multiple gates for performing a complete circuit function according to aspects of the present disclosure.

FIG. 2 illustrates an integrated circuit 200 including a first logical block 100 coupled to a second logical block 200A, in which the logical blocks include multiple gates for performing a complete circuit function according to aspects of the present disclosure. For illustrative purposes, some of the labelling and numbering of the devices and features of FIG. 2 are similar to those of FIG. 1. The first logical block 100 includes a first gate 106, a second gate 108 and a third gate 110. The first logical block 100 also includes the timing and/or inversion devices 104, 112 and 114.

In addition to the first logical block 100 described with respect to FIG. 1, the integrated circuit device 200 also includes a second logical block 200A. The second logical block 200A may be on a second tier or bottom tier 202. Similar to the first logical block 100, the second logical block 200A includes a first gate 206, a second gate 208, a third gate 210, timing and/or inversion devices 204, 212 and 214, and connectors 220, 222, 224, 226 and 228. The second logical block 200A also includes a primary input C and a primary output D. Similar to the primary input A and the primary output B of the first logical block 100, the primary input C and the primary output D are positioned at the boundary or the periphery of the second logical block 200A.

The first logical block 100 and the second logical block 200A may be a first or top tier 102 and a second or bottom tier 202, respectively, of the integrated circuit device 200. To couple the first logical block 100 to the second logical block 200A, a connection 216 is used to connect the primary input (A or C) of one of the logical blocks (100 or 200A) to the primary output (B or D) of the other of the logical blocks (100 or 200A). For example, the primary output B of the first logical block 100 is connected to the primary input C of the second logical block 200A using the connection 216. This connection between the primary output B and the primary input C is subject to the total delay (e.g., input timing path delay and output timing path delay) experienced in the first logical block and/or delay associated with the input timing path and/or the output timing path of the second logical block. To mitigate the delay associated with this inter-block connection between the primary output B to the primary input C, the inter-block connections are physically and/or logically propagated to the input and/or output ports of the gates of the logical blocks, as illustrated in FIG. 3.

Figure 3:
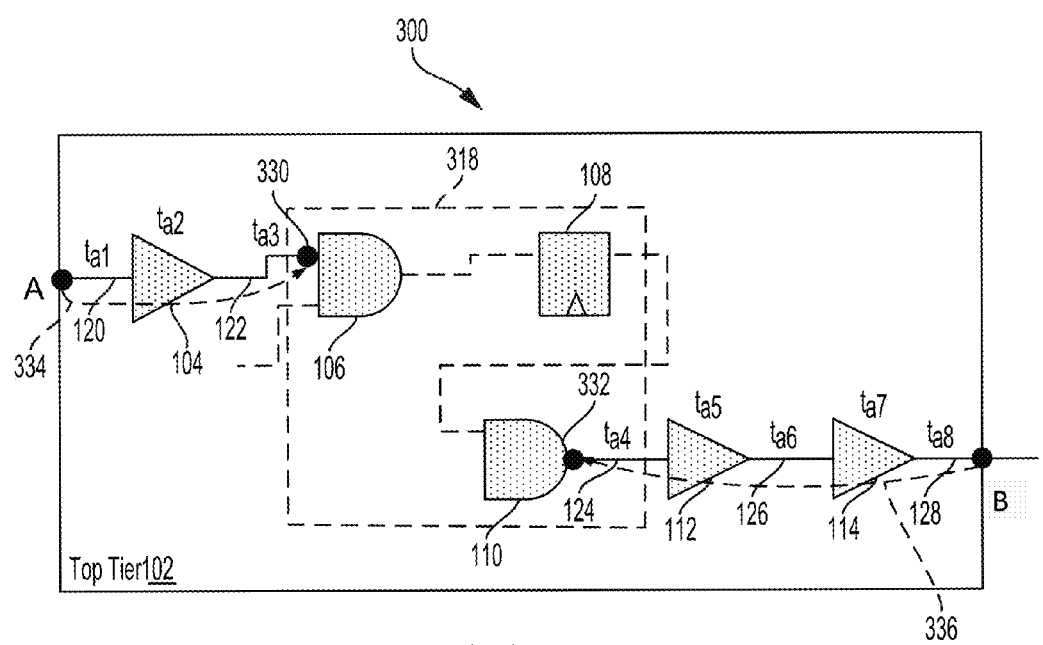
FIG. 3 illustrates a logical block including input/output ports used for inter-block connections that are physically and/or logically propagated to the input and/or output ports of the gates of the logical block according to aspects of the present disclosure.

FIG. 3 illustrates a logical block 300 including input/output ports used for inter-block connections according to aspects of the present disclosure. The inter-block connections are physically and/or logically propagated to the input and/or output ports of the gates of the logical block 300. For illustrative purposes, some of the labelling and numbering of the devices and features of FIG. 3 are similar to those of the FIG. 1. To avoid delays associated with the input timing path and/or the output timing path, connection ports for the inter-block connections are logically and physically propagated from the periphery of the logical block 300 to input ports of the gates of the logical block 300. For example, instead of implementing inter-block connections at the primary input A, the inter-block connections are implemented at an input port 330 of a first gate 106 of the logical block 300. A propagation line 334 from a primary input A to the input port 330 of the first gate 106 illustrates the physical propagation of the inter-block connection. This inter-block connection at the input port 330 of the first gate 106 avoids delays associated with the input timing path.

Further, instead of implementing inter-block connections at a primary output B, the inter-block connections are implemented at an output port 332 of a third gate 110 of the logical block 300. A propagation line 336 from the primary output B to the output port 332 of the third gate 110 illustrates the physical propagation of the inter-block connection. This inter-block connection at the output port 332 of the third gate 110 avoids delays associated with the output timing path.

In one aspect of the disclosure, the inter-block connections implemented at the input port 330 of the first gate 106 and/or the inter-block connections implemented at the output port 332 of the third gate 110 are within a perimeter 318 defined by a total area occupied by the logic gates (e.g., the first logic gate 106, a second logic gate 108, and the third logic gate 110) of the logical block 300.

Figure 4:
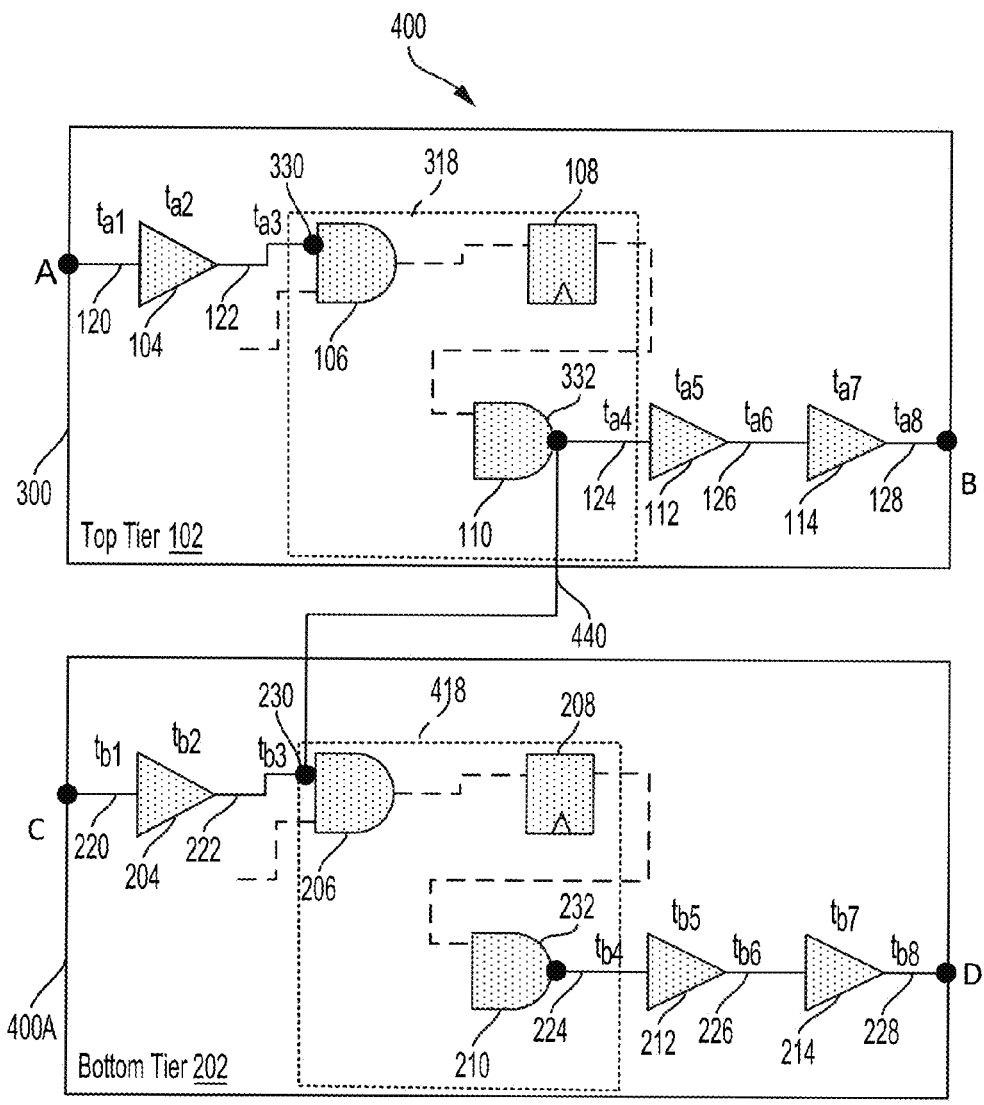
FIG. 4 illustrates an integrated circuit device including logical blocks coupled together with inter-block connections that are physically and/or logically propagated to the input and/or output ports of the gates of the logical blocks according to aspects of the present disclosure.

FIG. 4 illustrates an integrated circuit device 400 including logical blocks 300 and 400A coupled together with inter-block connections that are physically and/or logically propagated to the input and/or output ports of the gates of the logical blocks according to aspects of the present disclosure. For illustrative purposes, some of the labelling and numbering of the devices and features of FIG. 4 are similar to those of the FIG. 1, FIG. 2 and FIG. 3.

Similar to the logical block 300, the logical block 400A includes connection ports for the inter-block connections that are logically and physically propagated from the periphery of the logical block 400A to input and output ports of the gates of the logical block 400A. For example, instead of implementing inter-block connections at a primary input C, the inter-block connections are implemented at an input port 230 of the first gate 206 of the logical block 400A. Further, instead of implementing inter-block connections at a primary output D, the inter-block connections are implemented at an output port 232 of the third gate 210 of the logical block 400A.

To couple the logical block 300 to the logical block 400A, a connection 440 is used to connect the output port 332 of the logical block 300 to the input port 230 of the logical block 400A. In one aspect of the disclosure, the connection 440 is within the perimeter defined by the total area occupied by the logic gates of the logical block 300 and/or the total area occupied by the logic gates of the logical block 400A. This connection between the output port 332 and the input port 230 mitigates the delay associated with inter-block connection between a primary output B to the primary input C. In another configuration, the timing related or non-functional logic gates (e.g., timing and/or inversion devices 104, 112 and 114) are not bypassed in all cases. For example, a third logical block on a same or different tier (not shown) may be coupled to the output B, while the output port 332 of the logical block 300 is coupled to the input port 230 of the logical block 400A of the second tier 202, within the perimeters 318, 418 of the first and second tiers 102, 202.

Figure 5:
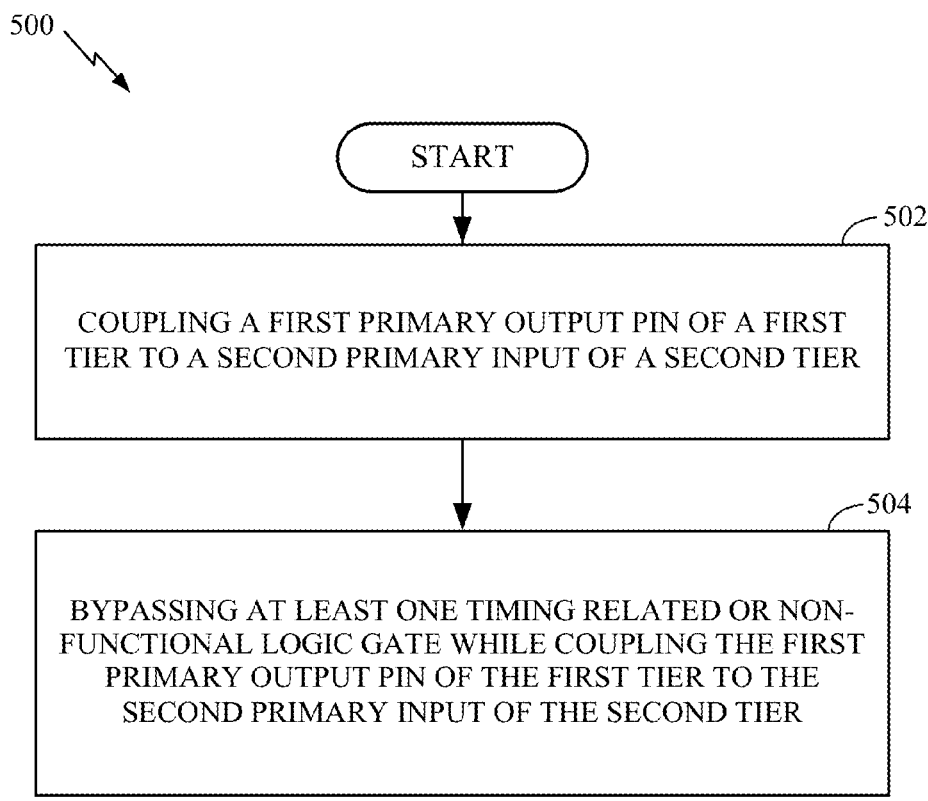
FIG. 5 is a process flow diagram illustrating logical connection propagation method according to an aspect of the present disclosure.

FIG. 5 is a process flow diagram 500 illustrating a logical connection propagation method according to an aspect of the present disclosure. In block 502, a first primary output pin of a first tier of a 3D IC is coupled to a second primary input pin of a second tier of the 3D IC. The first tier includes one or more first logical blocks. The first logical block(s) includes a first primary output logic gate, a first primary input logic gate, and a first primary input pin. The first primary output pin lies within a perimeter defined by a total area occupied by the logic gates of the first logical block of the first tier. The second tier includes one or more second logical blocks. The second logical block(s) includes a second primary output logic gate, a second primary input logic gate, and a second primary output pin. In block 504, one or more timing related or non-functional logic gates are bypassed while coupling the first primary output pin of the first tier to the second primary input pin of the second tier.

According to a further aspect of the present disclosure, a 3D integrated circuit device is described. The integrated circuit device includes means for implementing a first logical function of one or more first logic blocks. The first logical function implementing means may be the third gate 110. The integrated circuit device also includes means for implementing a second logical function of the first logic block(s). The second logical function implementing means may be the first gate 106. In another aspect, the aforementioned means may be any module or any apparatus configured to perform the functions recited by the aforementioned means.

Figure 6:
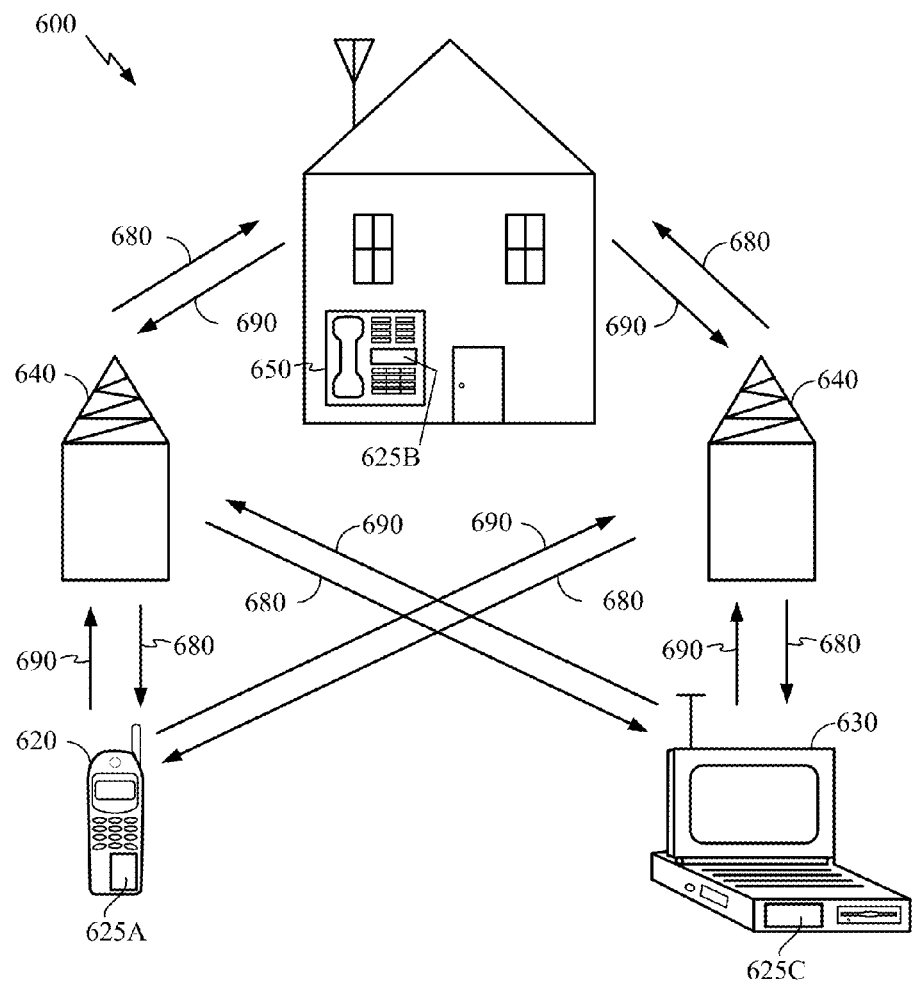
FIG. 6 is a block diagram showing an exemplary wireless communication system in which a configuration of the disclosure may be advantageously employed.

FIG. 6 is a block diagram showing an exemplary wireless communication system 600 in which an aspect of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C, and 625B that may include the disclosed 3D integrated circuit device. It will be recognized that other devices may also include the disclosed 3D integrated circuit device, such as the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, a remote unit may be a mobile phone, a hand-held personal communication systems (PCS) unit, a portable data unit such as a personal data assistants, a GPS enabled device, a navigation device, a set top box, a music player, a video player, an entertainment unit, a fixed location data unit such as a meter reading equipment, or other devices that store or retrieve data or computer instructions, or combinations thereof. Although FIG. 6 illustrates remote units according to the aspects of the disclosure, the disclosure is not limited to these exemplary illustrated units. Aspects of the disclosure may be suitably employed in many devices, which include the disclosed 3D integrated circuit device.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice-versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A 3D integrated circuit device, comprising:
   a first tier having at least one first logical block comprising a first primary output logic gate, a first primary input logic gate, a first primary input pin and a first primary output pin, the first primary output pin lying within a perimeter defined by a total area occupied by logic gates of the at least one first logical block of the first tier;
   a timing related or non-functional logic gate of the at least one first logical block between the first primary output pin and a primary output of the first tier, the timing related or non-functional logic gate of the at least one first logic block including a buffer;
   a second tier having at least one second logical block comprising a second primary output logic gate, a second primary input logic gate, a second primary input pin and a second primary output pin, the second primary input pin coupled to the first primary output pin; and
   a timing related or non-functional logic gate of the at least one second logical block between the second primary input pin and a primary input of the second tier, the primary output of the first tier capable of being coupled to the primary input of the second tier.

2. The integrated circuit device of claim 1, in which the second primary input pin is within a perimeter defined by a total area occupied by logic gates of the at least one second logical block.

3. The integrated circuit device of claim 2, further comprising a connection coupling the second primary input pin to the first primary output pin, the connection remaining within the perimeter of the first tier and the perimeter of the second tier.

4. The integrated circuit device of claim 1, in which the second primary input pin is outside a perimeter of the second tier.

5. The integrated circuit device of claim 1, in which the first primary output pin is coupled to a plurality of aligned vias and conductive layers that are coupled to the first primary output logic gate.

6. The integrated circuit device of claim 5, in which the plurality of aligned vias and conductive layers are vertically aligned.

7. The integrated circuit device of claim 1, in which the at least one first logical block is a multi-tier block.

8. A logical connection propagation method comprising:
   coupling a first primary output pin of a first tier of a 3D integrated circuit (IC) to a second primary input pin of a second tier of the 3D IC, the first tier having at least one first logical block comprising a first primary output logic gate, a first primary input logic gate, and a first primary input pin, the first primary output pin lying within a perimeter defined by a total area occupied by logic gates of the at least one first logical block of the first tier, the second tier having at least one second logical block comprising a second primary output logic gate, a second primary input logic gate, and a second primary output pin; and
   bypassing a timing related or non-functional logic gate of the at least one first logical block between the first primary output pin and a primary output of first tier or a timing related or non-functional logic gate of the at least one second logical block between the second primary input pin and a primary input of the second tier while coupling the first primary output pin of the first tier to the second primary input pin of the second tier, in which the at least one timing related or non-functional logic gate comprises a buffer or an inverter.

9. The method of claim 8, further comprising coupling the at least one timing related or non-functional logic gate to a third logical block on a same or different tier of the at least one first logical block or the at least one second logical block.

10. A 3D integrated circuit device, comprising:
    a first tier having at least one first logical block comprising a first primary input pin and a first primary output pin;
    means for implementing a first logical function of the at least one first logic block, the first logical function implementing means directly coupled to the first primary output pin;
    means for implementing a second logical function of the at least one first logic block, the second logical function implementing means directly coupled to the first primary input pin, the first primary output pin lying within a perimeter defined by a total area occupied by the first and second logical function implementing means of the at least one first logical block of the first tier;
    a timing related or non-functional logic gate of the at least one first logical block between the first primary output pin and a primary output of the first tier, the timing related or non-functional logic gate of the at least one first logical block including a buffer;
    a second tier having at least one second logical block comprising a second primary output logic gate, a second primary input logic gate, a second primary input pin and a second primary output pin, the second primary input pin coupled to the first primary output pin; and a timing related or non-functional logic gate of the at least one second logical block between the second primary input pin and a primary input of the second tier, the primary output of the first tier capable of being coupled to the primary input of the second tier.

11. The integrated circuit device of claim 10, in which the second primary input pin is within a perimeter defined by a total area occupied by logic gates of the at least one second logical block.

12. The integrated circuit device of claim 11, further comprising a connection coupling the second primary input pin to the first primary output pin, the connection remaining within the perimeter of the first tier and the perimeter of the second tier.

13. The integrated circuit device of claim 10, in which the second primary input pin is outside a perimeter of the second tier.

14. The integrated circuit device of claim 10, in which the first primary output pin is coupled to a plurality of aligned vias and conductive layers that are coupled to the first logical function implementing means.

15. The integrated circuit device of claim 14, in which the plurality of aligned vias and conductive layers are vertically aligned.

16. The integrated circuit device of claim 10, in which the at least one first logical block is a multi-tier block.

* * * * *